United States Patent
Langer et al.

(10) Patent No.: US 8,705,905 B2
(45) Date of Patent: Apr. 22, 2014

(54) PRINTED CIRCUIT BOARD ELEMENT AND METHOD FOR THE PRODUCTION THEREOF

(75) Inventors: Gregor Langer, Wölfnitz (AT); Johannes Stahr, Bruck an der Mur (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 379 days.

(21) Appl. No.: 12/675,884

(22) PCT Filed: Sep. 11, 2008

(86) PCT No.: PCT/AT2008/000321
§ 371 (c)(1),
(2), (4) Date: Mar. 1, 2010

(87) PCT Pub. No.: WO2009/036478
PCT Pub. Date: Mar. 26, 2009

(65) Prior Publication Data
US 2011/0135248 A1 Jun. 9, 2011

(30) Foreign Application Priority Data
Sep. 21, 2007 (AT) .................. A 1490/2007

(51) Int. Cl.
*G02B 6/12* (2006.01)
(52) U.S. Cl.
USPC .......................................................... 385/14
(58) Field of Classification Search
USPC .......................................................... 385/14
See application file for complete search history.

(56) References Cited

U.S. PATENT DOCUMENTS

| 5,444,804 A * | 8/1995 | Yui et al. ................ 385/49 |
| 2003/0039455 A1* | 2/2003 | Ouchi .................... 385/88 |
| 2006/0198569 A1* | 9/2006 | Ohtsu et al. ............ 385/14 |
| 2006/0269288 A1 | 11/2006 | Guidotti et al. |
| 2007/0183718 A1 | 8/2007 | Bae et al. |

FOREIGN PATENT DOCUMENTS

| AT | 503 027 A4 | 7/2007 |
| EP | 1 376 180 A2 | 1/2004 |
| JP | 10-253845 | 9/1998 |
| JP | 2006-113333 | 4/2006 |
| JP | 2006-234985 | 9/2006 |
| WO | 2005/064381 A | 7/2005 |
| WO | 2005/078497 A1 | 8/2005 |

OTHER PUBLICATIONS

Japanese Office Action Issued Aug. 29, 2012 With English Translation.

(Continued)

*Primary Examiner* — Uyen Chau N Le
*Assistant Examiner* — Hoang Tran
(74) *Attorney, Agent, or Firm* — Ladas & Parry LLP

(57) ABSTRACT

The invention relates to a printed circuit board element (10), comprising at least one flexible printed circuit board part (12) and at least one rigid printed circuit board part (11A, 11C; 34, 35; 37) having a component (17), which is accommodated in a cavity (14) and with a light-emitting or light-receiving part (17) projects over the edge (18) of the cavity (14), wherein the flexible printed circuit board part (12) has a flexible layer (15') made of an optical, photo-polymerizable material (15), in which an optical fiber (15) is structured in alignment with the light-emitting or light-receiving part (17) of the optoelectronic component (17) by way of radiation.

17 Claims, 11 Drawing Sheets

(56) References Cited

OTHER PUBLICATIONS

Espacenet Abstract of Japanese Application 2006-234985 Published Sep. 7, 2006.
Espacenet Abstract of Japanese Application 10-253845 Published Sep. 25, 1998.
Espacement Abstract of Japanese Application 2006-113333 Published Apr. 27, 2006.

* cited by examiner

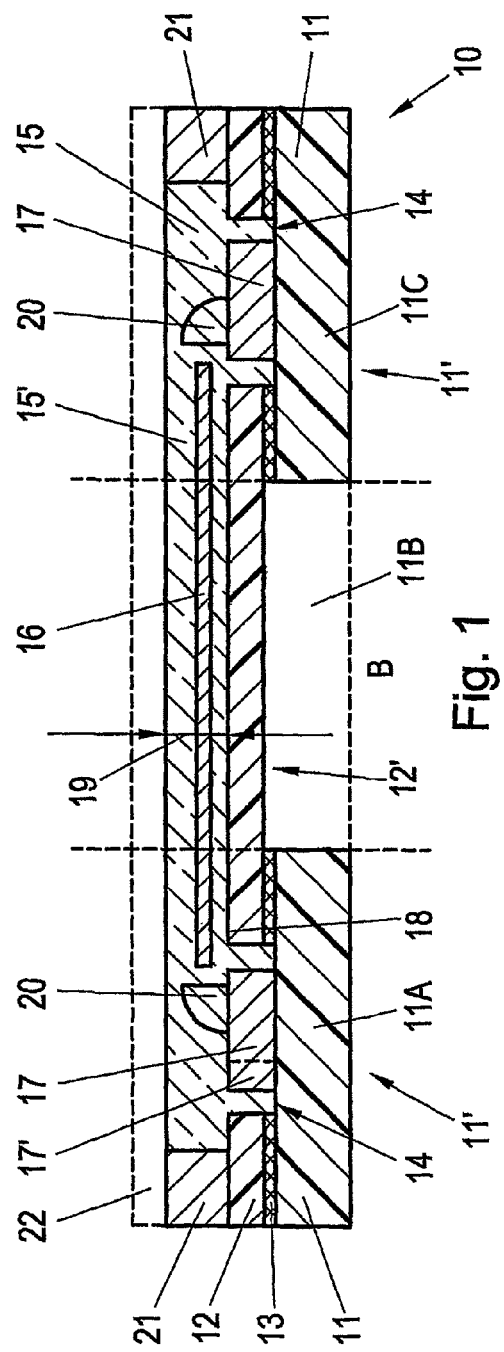
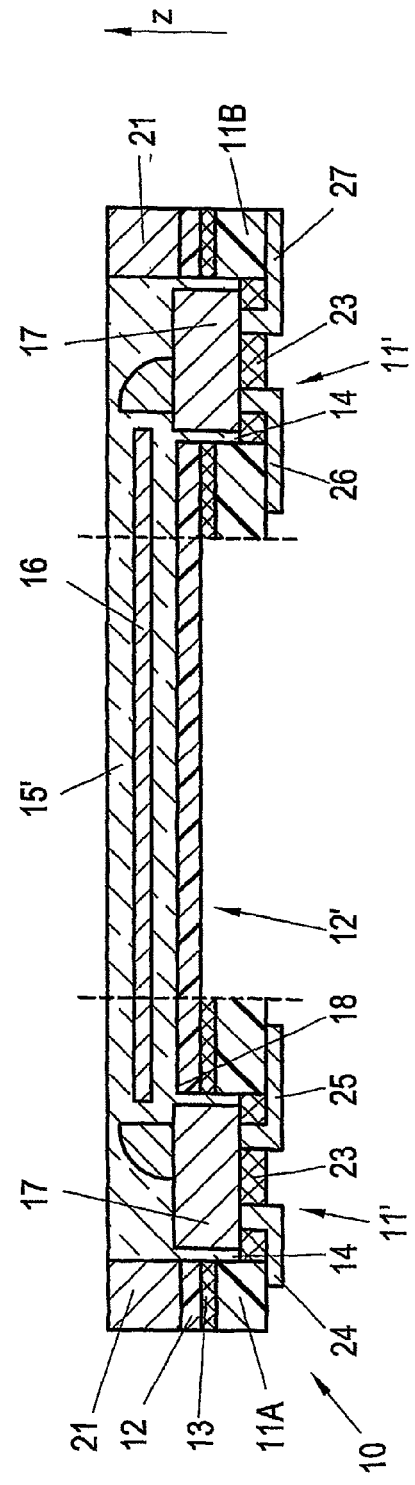
Fig. 1
Fig. 2

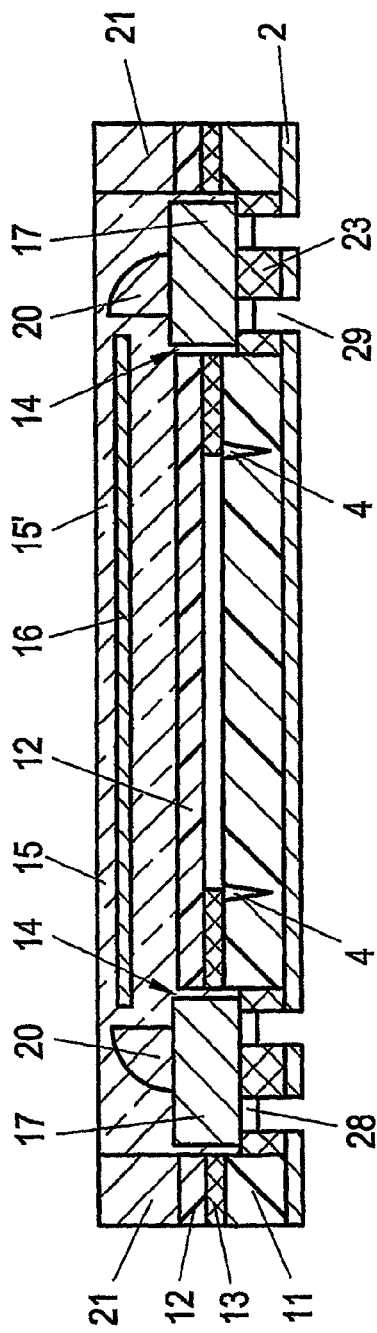
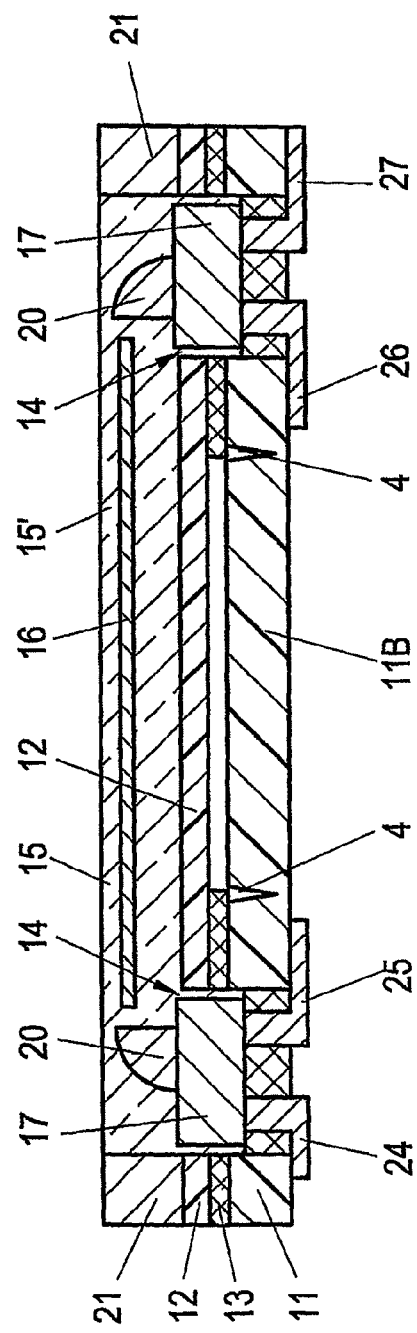
Fig. 2K
Fig. 2L

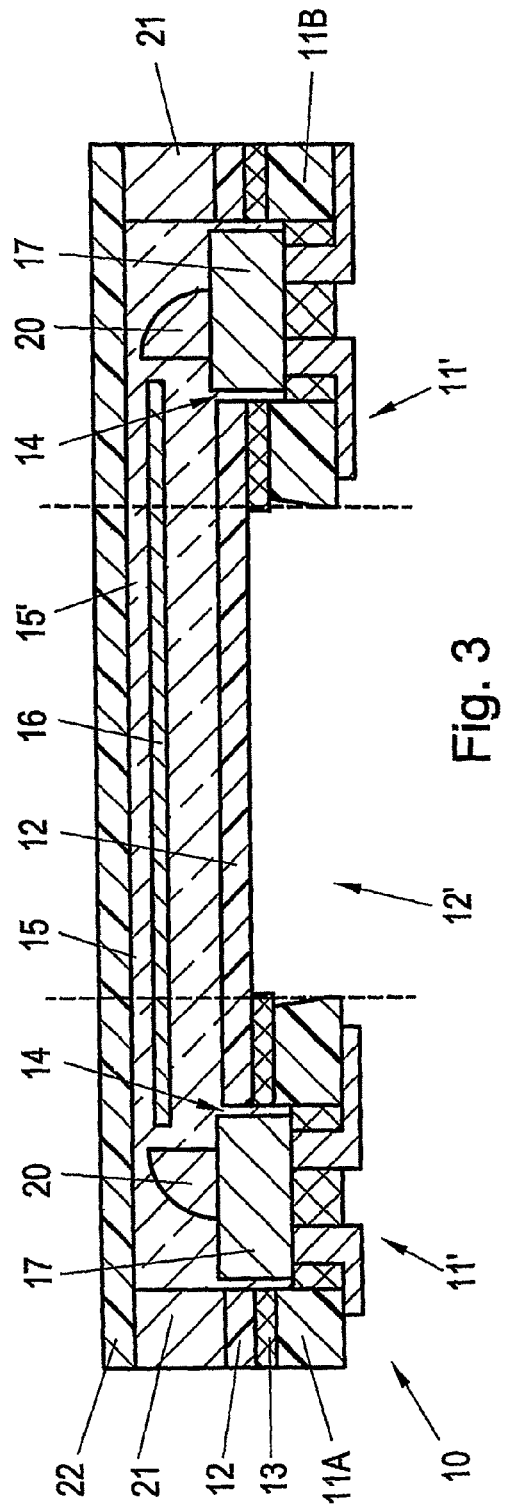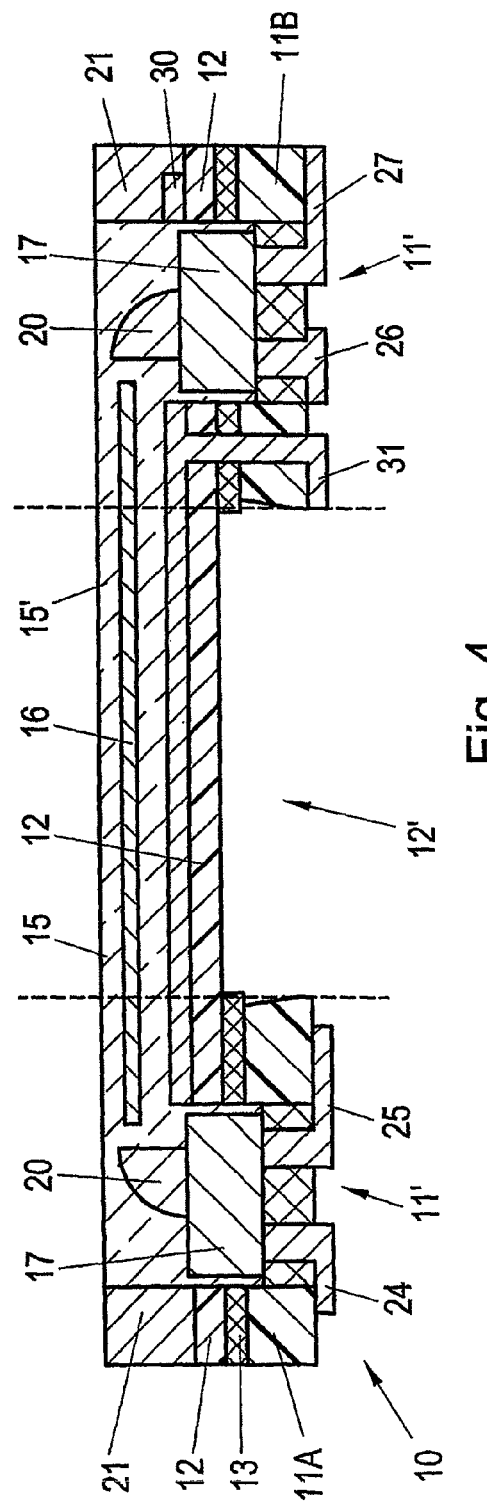

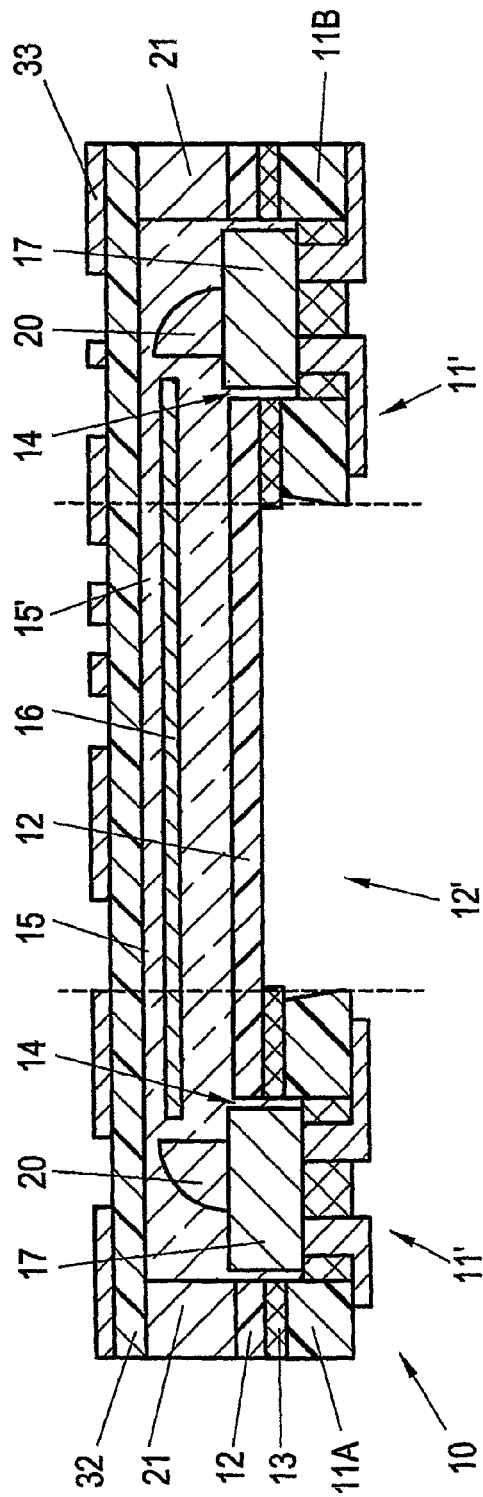
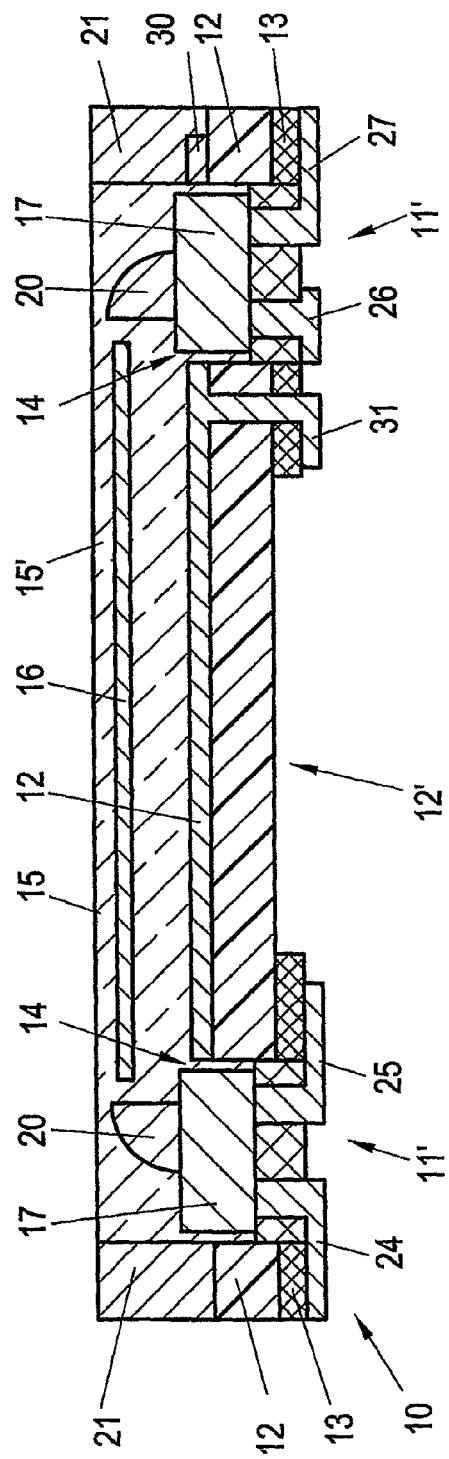
Fig. 5
Fig. 6

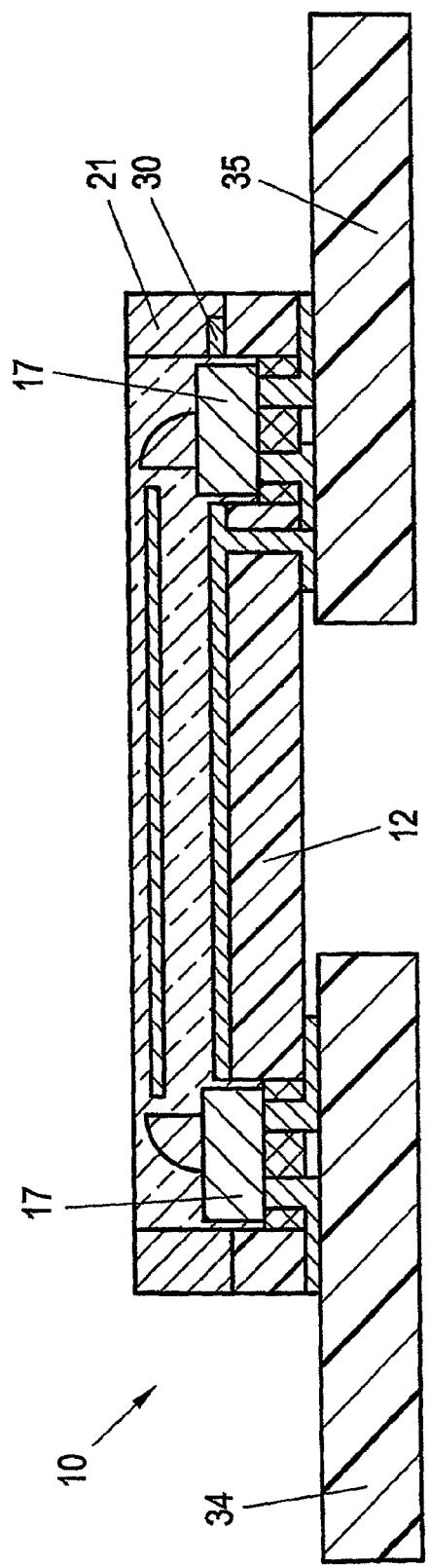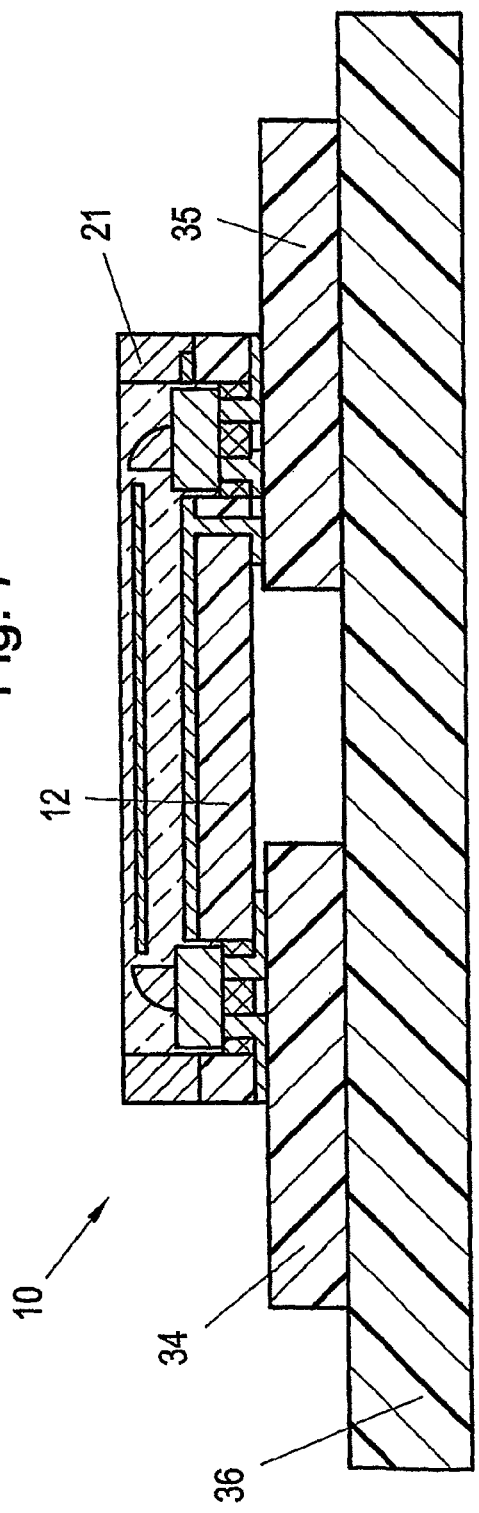

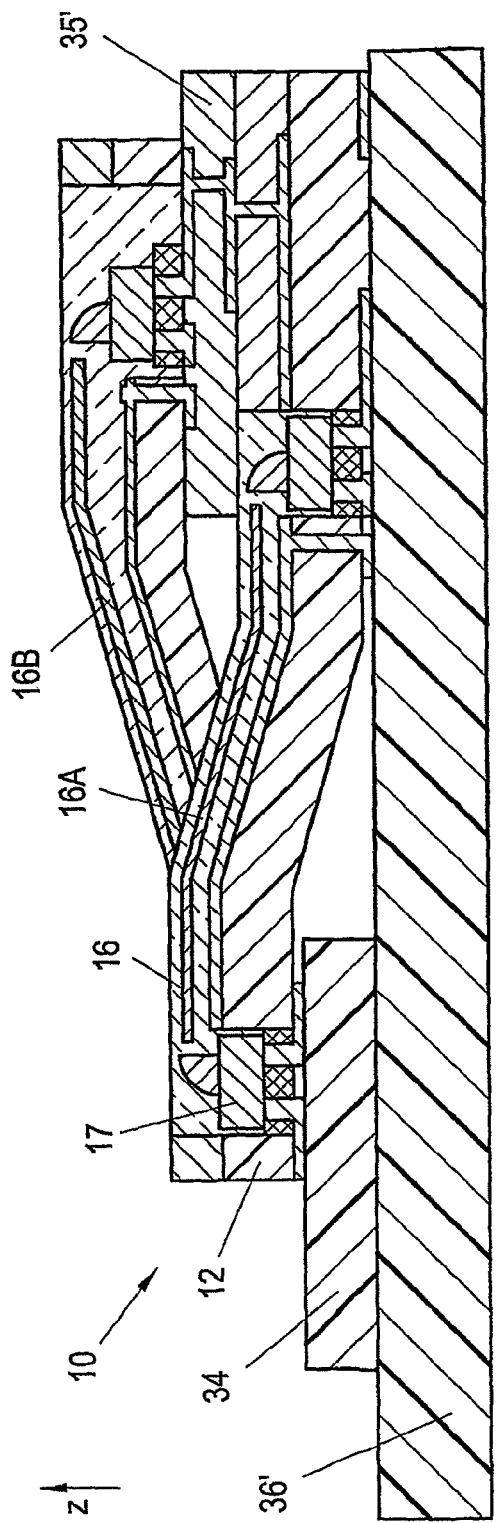
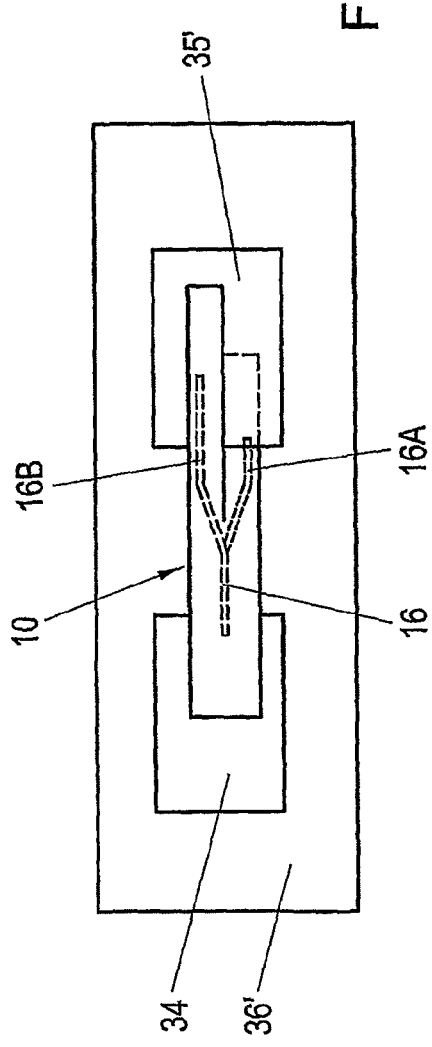

PRINTED CIRCUIT BOARD ELEMENT AND METHOD FOR THE PRODUCTION THEREOF

FIELD OF THE INVENTION

The invention relates to a printed circuit board element with at least one flexible printed circuit board portion and with at least one rigid printed circuit board portion with a component; furthermore, the invention relates to a method of producing such a printed circuit board element.

BACKGROUND OF THE INVENTION

Printed circuit board elements with rigid and flexible printed circuit board portions were proposed with regard to the necessity of foldable and bendable connections for the most varying of applications, starting from applications for the mounting of LEDs in steps, cf. e.g. DE 199 09 399 C1, up to applications of such partially flexible printed circuit boards in electronic devices with a foldable portion, such as mobile telephony devices, yet also portable computers (laptops, notebooks) and so-called handhelds, where, beyond hinge joints, a corresponding flexibility was required with regard to data and signal connections, respectively. Besides the application for foldable and/or bendable connections, rigid-flexible printed circuit board elements can also be used for so-called flex-to-install applications, in which the flexible printed circuit board part is bent only once in order to establish a connection between two printed circuit boards (e.g. motherboard, daughtercard), whereupon the flexible printed circuit board will then remain in this state. The structure of rigid-flexible printed circuit boards and their production, respectively, has been described in various documents, such as in EP 1 659 840 A1, WO 2005/055685 A1 or WO 2004/110114 A1. In these rigid-flexible printed circuit boards, the flexible printed circuit board portions form a type of film hinge between rigid printed circuit boards in order in this manner to enable a pivoting movement between the rigid printed circuit board portions. Copper connections pass over these flexible printed circuit board portions in a conventional manner.

On the other hand, it has already become known to integrate optical signal connections in printed circuit boards, cf. e.g. WO 2005/064381 A1, AT 503 027 B1 or US 2002/0028045 A1. Thus, the functionality of the printed circuit boards is substantially increased, and highly complex product applications can be realized, wherein a further miniaturization of the printed circuit boards, an increase in the integration density of switching characteristics and thus a higher product added value are rendered possible. Such printed circuit boards with optical connections can be used in cases where the applications require the transmission of large amounts of data between components or functional units and/or a space-saving design of the connection paths. So far, however, these integrated optical connections have been practically restricted to rigid printed circuit boards, even though in the aforementioned US 2002/0028045 A1 an embodiment with an optical connection on a flexible substrate has already been described. Intrinsically, however, this document relates to the mounting of optical connections on multi-component modules (MCMs), and not on printed circuit boards, and the flexible printed circuit board is only described there in order to be able to produce a flexible installation and, in doing so, an optical connection to another module, production inaccuracies being compensated by means of the flexibility.

Now the invention is concerned with the object of combining the two aforementioned technologies, namely rigid-flexible-rigid printed circuit board elements on the one hand, and optical connections integrated in printed circuit boards, i.e. optical waveguides, on the other hand, in an efficient manner, in order in this manner to combine the advantages of transmitting high data rates with low space and shielding outlay and of increasing the reliability and design options, and to provide a new high-tech printed circuit board element that offers additional, new options to the electronics sector.

SUMMARY OF THE INVENTION

A problem to be overcome here consists in enabling a space-saving construction, and in particular as low a structural height as possible in this case despite the additional optical waveguide connection. Above all, there is also the problem in this case of not negatively affecting the flexibility of the composite printed circuit board element as a whole, but to at least retain, if possible, the existing flexibility by means of a very thin flexible printed circuit board part. On the other hand, the demands on a rigid-flexible printed circuit board element should be met in the usual sense, wherein lasting connections are provided instead of temporary ones, and a long-lasting mechanical loading, such as during opening and closing of a mobile telephony device or a portable computer is to be rendered possible. Yet, a use of the rigid-flexible printed circuit board element should also be possible for temporary connections. A rigid-flexible printed circuit board element may, for example, serve for the temporary connection of two printed circuit boards in the form of an electric plug. In this case, the rigid-flexible printed circuit board element constitutes an "optical cable".

From AT 503 027 B1, a printed circuit board element with an embedded optoelectronic component is known which has an integrated mirror for deflecting the light radiation.

Therefore, one concern of the invention is in particular to be seen in the fact that an optimum integration of the optoelectronic components in a rigid-flexible printed circuit board element should take place so as to ensure low construction height as well as low thickness of the flexible printed circuit board part and thus its high flexibility in the case of the desired applications.

To solve the problem set, the invention provides a printed circuit board element as well as a production method as defined in claims 1 and 17. Advantageous embodiments and developments are indicated in the dependent claims.

In the case of the rigid-flexible printed circuit board element, the mounting of a waveguide layer, i.e. a layer made from an optical material, for example on a separate flexible printed circuit board part and above the optoelectronic component without thereby substantially increasing the structural height is rendered possible in an efficient manner in that the, or each, optoelectronic component is mounted in a cavity in the printed circuit board element, i.e. preferably in the connecting region between a rigid and a flexible printed circuit board portion, particularly preferably in the flexible printed circuit board portion. With its light emitting part or light-receiving part, the optoelectronic component projects upwards just to such an extent that it is located slightly higher than the upper side of the cavity or of the flexible printed circuit board portion, above which the—flexible—layer of the optical photo-polymerizable material is applied. In this layer made of optical material, the optical waveguide is structured by means of irradiation, in alignment with the light-emitting part or light-receiving part, respectively, of the optoelectronic component. For this structuring, preferably the multi-photon absorption method already described in WO 2005/064381 A1 is used in which a chemical reaction, i.e.

polymerization, is activated by the simultaneous absorption of a plurality of—generally two—photons. With regard to the two-photon absorption, this process generally is also called the TPA process (TPA—two photon absorption). For example, the optical material to be structured is transparent for the employed excitation wavelength (e.g. 800 nm) of a light source (in particular, a laser source). Therefore, there will be no absorption within the material and no single-photon process. In the focus range of the light or laser beam, however, the intensity is so high that the material absorbs two (or more) photons, as a result of which a chemical reaction is activated. In this case, it is also an advantage that due to the transparency of the optical material for the excitation wavelength, all the points in the layer can be reached and thus three-dimensional structures can be inscribed in the layer without any problems. "Three-dimensional" is in this case understood to mean that the optical waveguide need not only extend in one plane (x-y plane), but rather can also vary in height (z-direction), i.e. it may extend in the x, y and also z-directions, but also that the optical waveguide can exhibit changes in its shape over its longitudinal extent in the x, y and z-directions, e.g. by its cross-section being able to change from circular to flat-elliptical, back to circular, and to up-right elliptical.

The multi-photon absorption process described is a single step structuring process in which no multiple exposures and no wet-chemical development steps are required.

Besides, for further information, reference may be made to WO 2005/064381 A1.

As has been mentioned, an integration of an optical waveguide structured by a photon-absorption process in a rigid-flexible printed circuit board element is enabled in an efficient manner for the first time by means of the invention, wherein a compact bonding of the optical waveguide to the optoelectronic components which are completely embedded in the optical material is achieved, and a high flexibility is ensured in the flexible region of the hybrid printed circuit board element.

It may be mentioned that in WO 2005/078497 A1, a—rigid—multi-layer printed circuit board element is described in which a blind-hole-type depression is bored from the upper side thereof, in which subsequently an optoelectronic component is mounted which communicates with an optical bus between two insulating layers. In that case, the component is glued to a discontinuous metal layer in the depression.

The connection between the—in particular separate—flexible printed circuit board portion and the rigid printed circuit board portion(s) may preferably be achieved with the aid of an adhesive layer. The adhesive layer may for example be formed by a thermosetting adhesive, pressure-sensitive adhesive, so-called pre-pregs (i.e. non-cured, fibreglass-reinforced epoxy resin layers) or the like. Here, it is suitable to obtain a prefabricated, rigid-flexible printed circuit board element such that a still continuous rigid printed circuit board portion is provided with an adhered flexible printed circuit board portion, e.g. a polyimide film, whereupon a region of the rigid printed circuit board portion is removed by milling out or cutting out or such processing, so that at least one rigid printed circuit board portion, preferably two rigid printed circuit board portions, which are present at a distance from one another, remain, wherein the, or each rigid printed circuit board portion is connected to the flexible printed circuit board portion via the adhesive layer. In this pre-fabricated printed circuit board element thus obtained, which, of course, may be provided with copper layers or conductive copper tracks, with through-connections, such as in the form of micro-vias (μ-vias) or the like in the usual manner, the cavities or hollow spaces for the optoelectronic components are then provided e.g. by milling, these cavities in particular being formed in the flexible printed circuit board portion as well as in the adhesive layer; accordingly, the respective inserted and mounted optoelectronic component may be seated with its base surface directly on the upper side of the rigid printed circuit board portion, wherein it may be contacted there in a conventional manner. Laterally and on the upper side, the optoelectronic component in this phase of production is still free, and when afterwards the optical, photo-polymerizable material is applied for forming the optical layer, the optoelectronic component is enclosed by this optical material all around and on the upper side and embedded therein. For this application of the layer of the optical photo-polymerizable material, a flexible frame may be applied before-hand on the upper side of the printed circuit board element, which frame surrounds the optical layer after the latter has been applied and keeps the optical material, which is viscous when it is being applied, in place. Subsequently, the flexible frame may also be removed again so as to increase flexibility. This flexible frame may for example be made of a polyimide film.

According to an alternative embodiment, the previously mentioned separate flexible substrate layer may be omitted as flexible printed circuit board part, and the flexible printed circuit board part may be formed by the optical layer itself. During the production of such a printed circuit board it is possible to proceed in such a manner for example that at first only a rigid substrate is present, which is provided with the cavities and the optoelectronic components arranged therein, as well as, subsequently, with the optical layer in which the optical waveguide is structured, a part of the rigid substrate finally being removed so that, e.g. between two remaining spaced-apart rigid printed circuit board parts, only the flexible layer formed solely by the optical layer remains.

The or each optoelectronic component may be constructed with an integrated deflection mirror connected at its upper side, as a light emitting part or else as a light-receiving part, and preferably only this deflection mirror projects beyond the upper side or upper edge of the cavity, whereas the optoelectronic component proper is housed completely within the cavity, i. e. is especially located lower than the upper side of the flexible printed circuit board portion. The optoelectronic component may for example be a VCSEL (vertical cavity surface emitting laser) component, it may in this case however also be a different, well-known optoelectronic component, such as a photodiode or a phototransistor, just as well as a light-emitting diode (LED). The flexible printed circuit board portion itself may likewise carry conventional copper tracks which, in the finished rigid-flexible printed circuit board element, are embedded and protected in the optical layer.

The optical layer may be provided with a flexible cover layer as a protective layer and thus be protected. Besides a mechanical protection, the flexible cover layer may also protect against light irradiation so as to prevent interferences of the light waveguide. To this end, the flexible cover layer preferably is coloured and absorbs light irradiated in from the outside. This cover layer may for example be made of polyimide.

In principle, the present rigid-flexible printed circuit board element may in further steps also be developed to a multilayer printed circuit board.

From the previous statements, it already results that at least two rigid printed circuit board parts are provided in the rigid-flexible printed circuit board element at a distance from one another, the distance or space between these two rigid printed circuit board parts being bridged by the flexible printed circuit board part; an optoelectronic component (a transmitter and a receiver) being arranged in a cavity on each rigid printed circuit board part, and the optical waveguide extending between these two optoelectronic components.

Of course, further components may also be housed in a conventional manner in the present rigid-flexible hybrid printed circuit board.

The present technology utilizes the advantages of the rigid-flexible printed circuit board and of the TPA structuring of optical waveguides for producing highly-integrated optical signal connections in a printed circuit board element. By means of the proposed technology, it is possible in this case that both optical material, which as a rule is comparatively expensive, is saved and a very thin and consequently highly flexible bending region of the printed circuit board element is realized.

The present technology may be employed in optoelectronic hybrid printed circuit boards with multi-mode or single-mode wave guides for high data transfer rates, with a great design freedom being achieved. Fields of application are for example optoelectronic backplanes, flexible and rigid-flexible printed circuit boards, such as for mobile phones or laptops and hand-helds. For such applications, a high flexibility and reliability of the flexible connection is important in view of the frequent opening and closing.

A particular advantage resides in the minimizing of the layer thickness, primarily also of the optical material, in the flexible regions of the present rigid-flexible printed circuit board elements, which is of particular importance for the rigid-flexible printed circuit boards with the many hinge-type connecting regions.

BRIEF DESCRIPTION OF THE DRAWINGS

The invention will now be explained still further on the basis of preferred exemplary embodiments, to which it should not be restricted however, and with reference to the drawing.

In the figures:

FIG. 1 shows a schematic cross-section through a rigid-flexible printed circuit board element with an integrated optical connection;

FIG. 2 shows an embodiment of a rigid-flexible printed circuit board element in a cross-section comparable to FIG. 1, which embodiment is somewhat modified in comparison thereto;

FIGS. 2A-2L show consecutive stages in the production of such a printed circuit board element according to FIG. 2;

FIGS. 3-10 show further modifications of a rigid-flexible printed circuit board element in sections similar to FIGS. 1 and 2;

FIGS. 11 and 11A show, in a schematic section and in a schematic top view, respectively, an embodiment of a printed circuit board element according to the invention with an optical waveguide at various levels.

DETAILED DESCRIPTION

Figure 2A:
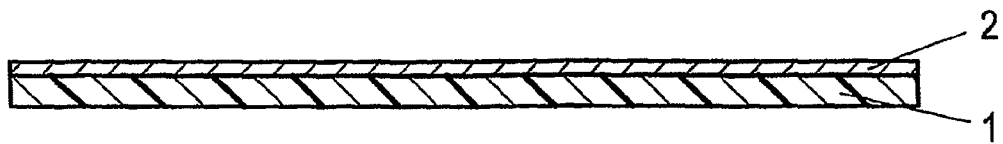

In FIG. 1, a rigid-flexible printed circuit board 10 is only quite schematically shown, without a true-to-scale illustration of the individual components, which printed circuit board has a rigid substrate 11 as a base, from which two rigid printed circuit board parts (portions) 11A, 11C are formed; these rigid printed circuit board parts 11A, 11C define two rigid areas 11' and are separated from each other by an open region B which has been obtained by removing a substrate portion 11B indicated in broken lines, and which is bridged by a flexible printed circuit board part (portion) 12 that provides a bendable connection between the two rigid printed circuit board parts 11A and 11C.

In the exemplary embodiment shown, a separate flexible printed circuit board part 12, e.g. a polyimide film, is provided, which is attached onto the two rigid printed circuit board parts 11A and 11C with the aid of an adhesive layer 13.

When producing this so-far described rigid-flexible printed circuit board element 10 it is basically possible to proceed as will be explained hereinafter on the basis of FIGS. 2A to 2L in connection with the modified embodiment according to FIG. 2. In short, a continuous rigid substrate 11, e.g. made of FR4 material, i.e. a cured, fiberglass-reinforced epoxy resin plate, can be used. The adhesive layer 13 may consist of a conventional single or multi-component adhesive which may for example be curable in a thermally cross-linking manner. Yet, also a pressure-sensitive adhesive or a thermoplastic adhesive may be used, just as the adhesive layer 13 may also consist of non-cured epoxy resin layers, in particular fibreglass-reinforced epoxy resin layers (pre-pregs). The flexible substrate for the flexible printed circuit board part 12 is pressed onto the rigid substrate 11 via such an adhesive layer 13 or resin layer. Both the adhesive layer 13 and the flexible printed circuit board part 12 are used in a pre-assembled state so that prefabricated cavities 14 are obtained in certain regions.

Subsequent to the mounting of the flexible printed circuit board part 12 as well as to further steps, such as structuring etc., cf. also the following description by way of FIGS. 2 to 2L, the substrate part 11B will be taken out of the rigid substrate 11 in the region B so that the two rigid printed circuit board parts 11A and 11C remain. The part in which the now removed substrate part 11B existed and which now is free, is bridged by the flexible printed circuit board part 12, as a result of which a bendable connecting region in the manner of a film hinge is obtained here, conductive connections existing in this flexible connecting region, however, as a rule.

In particular, an optical connection is integrated in the present rigid-flexible printed circuit board 10, an optical material 15 being applied as optical layer 15' in which an optical waveguide 16 is structured for example in the manner described in WO 2005/064381 A1. A common optical material 15 for forming the layer 15' is for example an inorganic-organic hybrid material, such as an organically modified ceramic material which is produced by means of a sol-gel process. Another known optical material is an inorganic-organic hybrid glass which is likewise produced in a sol-gel process and doped with a photoinitiator (benzyl-dimethyl-ketal). This hybrid glass consists of methyl acrylate with a silica/zirconia network. Further known materials are for example photosensitive imides or polyimides, respectively, organo-silsesquioxanes, silicone rubbers or the like.

However, before the optical material 15 is applied on the hybrid printed circuit board with the rigid printed circuit board parts 11A, 11C and the flexible printed circuit board part 12, the desired optoelectronic components 17 are inserted in the cavities 14, which components, in the exemplary embodiment shown in FIG. 1, rest with their lower sides directly on the rigid printed circuit board parts 11A, 11C. The contacting of these optoelectronic components 17 may e.g. be effected in a conventional manner via wire-bond connections (gold wire contactings), yet also via subsequent micro-via contactings (connections by means of coppered laser bores after the integration of the components in the printed circuit board), or also with the aid of a contacting method such as described in WO 2005/125298 A2, however; in the latter instance, the cavities 14 would also be present in the rigid printed circuit board parts 11A, 11C, cf. also FIGS. 2 and 2A to 2L to be described hereinafter.

As the optoelectronic components 17, a laser diode, or a VCSEL component, and a photodiode, respectively, are used for example. Since these optoelectronic components 17 are inserted in prefabricated cavities 14 instead of being simply put onto the flexible printed circuit board part 12, an extremely low structural height is rendered possible, particularly in the region of the flexible connection between the two rigid printed circuit board parts 11A, 11C. By "sinking" the components 17 in the cavities 14 of the pre-fabricated rigid-flexible printed circuit board element 10, the light emission field of the optoelectronic component functioning as a light emitter, e.g. the left-hand component 17 in the illustration according to the drawing, as well as the light detection field of the light receiver component (e.g. a photodiode) may be brought just scarcely above the edge 18 of the cavity 14, or of the uppermost flexible layer of the—separate—flexible printed circuit board part 12. This allows a minimum layer thickness 19 of the optical layer 15' above the separate flexible printed circuit board part 12, which leads to savings in optical material on the one hand, and primarily to the realization of a very thin and, thus, highly flexible layer 15'.

From FIG. 1 it can be seen that in the present exemplary embodiment, the optoelectronic components 17 are provided with deflection mirrors 20 put thereupon, whereby said components project over the edges 18 of the cavities 14 solely with these deflection mirrors 20. Between these deflection mirrors 20 as light emitting part and light receiving part, respectively, of the optoelectronic components 17, the optical waveguide 16 structured by a TPA process extends, also termed optical guide 16 for short hereinafter. In an optical guide 16 inscribed in such a manner having a circular cross-section for example with a diameter of for example 30 µm and with remaining "cladding" layers formed by the remaining optical layer 15' and having a thickness of, e.g., 35 µm above and below the optical guide 16, an optical layer 15' having a thickness of merely 100 µm can thus be provided. Therefore, when using a thin, flexible substrate film as the flexible substrate part 12, for example with a thickness of merely 25 µm, a highly flexible printed circuit board part 12' can be realized as a whole, including the integrated optical guide 16. By adapting the thickness of the adhesive layer 13, the height of the optoelectronic components 17 may further be equalized such that the optical material 15 on the separate flexible printed circuit board part 12 achieves a minimum thickness.

The thickness of the optical layer 15' can be adjusted by a further pre-assembled flexible frame layer which forms a frame 21 that is pressed on the uppermost layer of the separate flexible printed circuit board part 12. This flexible frame 21 consists for example of a polyimide film just as the flexible printed circuit board part 12 does, and it forms a boundary for the optical material 15 which during the production process preferably is filled as a viscous liquid into the cavities 14 and applied as the layer 15', the optoelectronic components 17 being practically completely embedded (apart from the base surface). To increase the flexibility, the flexible frame 21 may subsequently also be removed again.

Instead of using a polyimide film for forming the flexible frame 21, also a liquid material (silicone rubber, polyimide compounds, etc.) which, e.g., may be printed on or injected, may be applied to the flexible printed circuit board part 12.

The frame 21 can be applied prior to the insertion of the components 17 or thereafter.

Finally, the optical layer 15' may also be protected by a flexible cover layer or coat 22—merely hinted at in FIG. 1—for which a polyimide film may likewise be used for example. This flexible cover layer 22 protects the optical layer 15' not only mechanically, but also against light irradiation so as to prevent interferences in the light transmission. To this end, the flexible cover layer 22 preferably constructed to be coloured and capable of absorbing light radiated in from the outside.

As an alternative to the above-described production using a flexible frame 21 and pouring in the optical material 15, the optical layer 15' could also be applied by means of stencil printing or e.g. by means of inkjet technology. At first, the rigid substrate 11 is scored on the upper side at the locations where it should be broken later on. Finally, the flexible printed circuit board part 12 will be pre-assembled for example from polyimide or flexible fibreglass-reinforced epoxy resin layers or the like, and those areas, in which components should be introduced later on, are cut out, e.g. by milling out, laser cutting, punching or the like. The flexible printed circuit board part 12 is applied on the rigid substrate with the aid of an adhesive layer 13, and compressed with the former.

The rigid-flexible printed circuit board element 10 thus obtained may, in further steps, also be further processed to obtain a multilayer printed circuit board.

The flexible layer, or the flexible printed circuit board portion 12', as a whole may also carry copper tracks in a conventional manner, which is not further illustrated in FIG. 1, wherein these copper tracks (e.g. for power supply) then are embedded and protected in the optical layer 15'.

In an alternative embodiment, the separate flexible substrate film 12 may also be omitted. In this case, the cavities 14 will previously be formed in the rigid printed circuit board parts 11A, 11C, wherein the optical material 15 is directly applied to the rigid substrate 11, even before removing the substrate part 11B for obtaining the region B for the flexible connection, and the optical guide 16 is structured. After removal of the substrate part 11B in the region B, a flexible substrate portion 12 is in turn obtained which then, however, will be formed solely by the optical layer 15'.

In the following, various modifications and developments—as partially already suggested before—regarding the present printed circuit board element will briefly be described in more detail on the basis of FIGS. 2 to 12.

In FIG. 2, a printed circuit board element 10 is shown which is modified relative to that of FIG. 1 insofar as there the cavity 14 is provided not only in the flexible printed circuit board portion 12, but also in the rigid printed circuit board parts 11A, 11B. Thus, the optoelectronic components 17 may project more deeply into the assembly in z-direction, so that the flexible printed circuit board portion 12 which for example in turn is glued to the two rigid printed circuit board parts 11A, 11B by means of an adhesive 13, may be comparatively thin and/or each component 17 may be comparatively high. Furthermore, it can also be seen from FIG. 2 that the optoelectronic components 17 are fixed in the rigid printed circuit board parts 11A, 11B by means of a non-conductive adhesive 23. Moreover, electrical connecting elements 24, 25, 26 and 27 of the components 17 can also be seen in FIG. 2 on the lower side of the printed circuit board element 10. These connecting elements 24, 25 consist for example of copper.

Incidentally, the structure of the printed circuit board element 10 according to FIG. 2 corresponds to that according to FIG. 1 so that a further explanation may be superfluous, particularly since also for mutually corresponding components, corresponding reference numbers are also used.

For producing such a printed circuit board element 10 according to FIG. 2 (and, accordingly, also the printed circuit board element 10 according to FIG. 1, and of the printed circuit board elements according to FIG. 3 ff, respectively, still to be explained in more detail), it is possible for example to start with a carrier material 1 having a copper layer 2 laminated thereon, as illustrated in FIG. 2A. If contacting of the components 17 from the lower side is desired, according to FIG. 2B holes 3 will be bored in the copper layer 2, e.g. by laser boring; these holes 3 will later on be used for contacting (cf. FIG. 2). Subsequently, according to FIG. 2C, a pre-preg is applied to the base substrate 1-2 for forming the substrate 11 according to FIGS. 1 and 2, cavities 14' having been previously made in the pre-preg, e.g. by laser cutting, punching, milling or the like. Subsequently, according to FIG. 2D, scoring lines 4 are made in the pre-preg (substrate 11) on the upper side in order to allow for an easy separation of the middle part 11B of the substrate later on (cf. also FIG. 1).

Figure 2B:
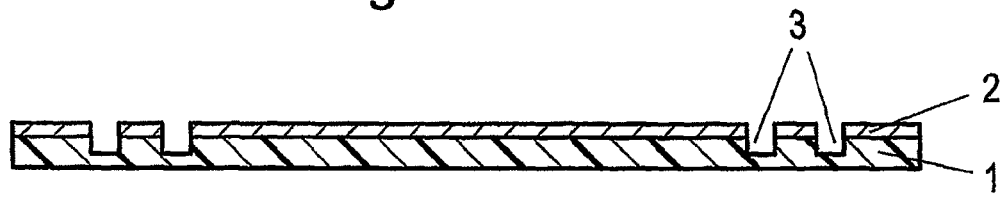
Figure 2C:
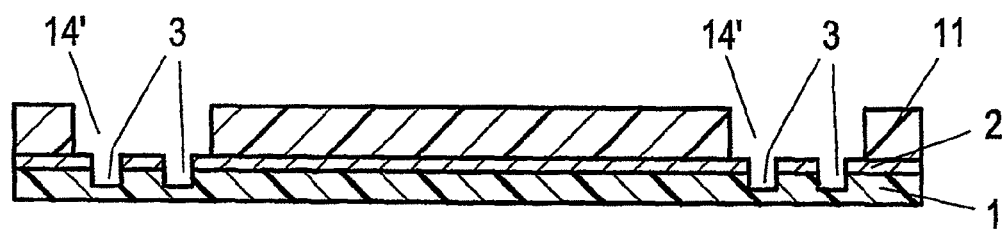
Figure 2D:
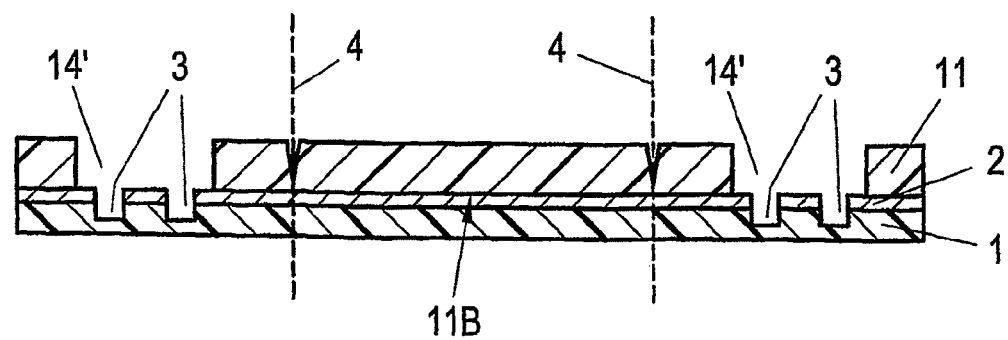
Figure 2E:
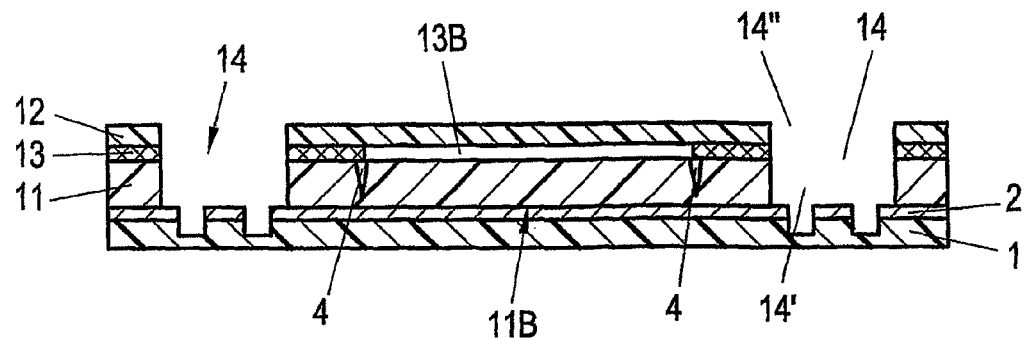

As can be seen from FIG. 2E, a separate flexible substrate part 12, e.g. a polyimide film or a flexible pre-preg having cavities 14" produced by e.g. laser cutting, punching, milling etc., is glued to the pre-preg substrate 11 with the aid of the adhesive layer 13 mentioned (e.g. a specific adhesive or a pre-assembled pre-preg), wherein, however, the region of the separable central part 11B of the substrate is not glued, i.e. in the region 13B between the scoring lines 4, no adhesive 13 is present.

Figure 2F:
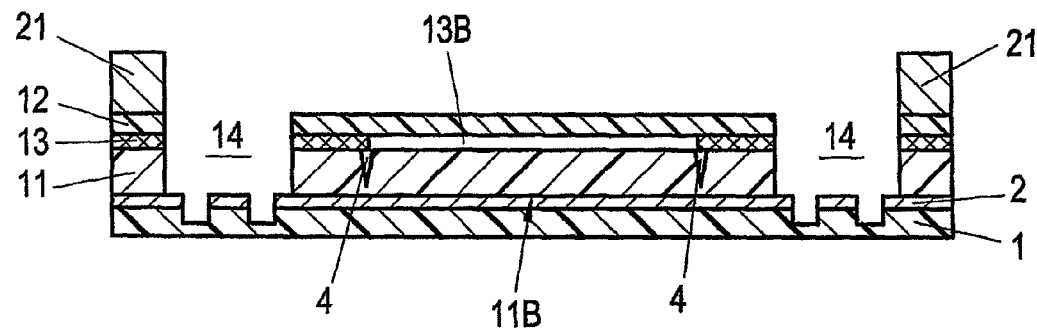

According to FIG. 2F, now the flexible frame 21 is glued to the hitherto obtained structure, in particular at the rim side onto the flexible printed circuit board part 12, for example in the form of a further flexible substrate, such as a polyimide film including an adhesive layer (not illustrated) having an appropriate clear inner space (e.g. made by laser cutting, punching, milling, etc.); as an alternative, also printing on or injecting a liquid material, e.g. silicone rubber or polyimide compounds that are still liquid, is conceivable, an appropriate curing for forming the flexible frame 21 following thereafter. The structure thus obtained now is ready for receiving the optoelectronic components 17 in the formed cavities 14 overall, as well as the optical material 15 for forming the optical waveguide 16.

Figure 2G:
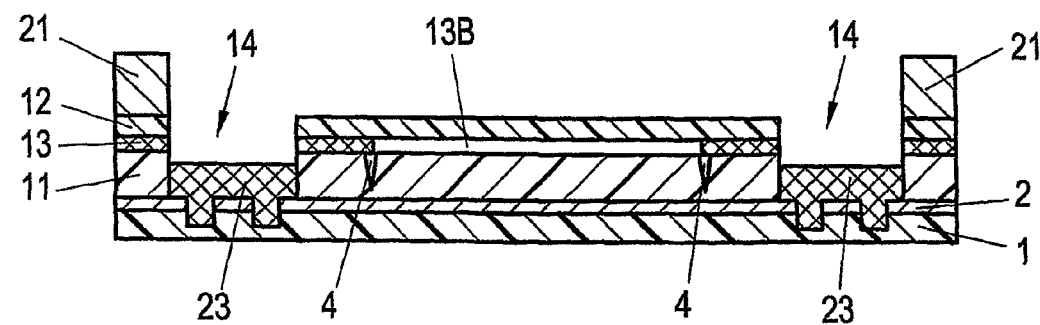

To introduce the desired optoelectronic components 17 into the cavities 14, electrically non-conductive adhesive layers 23 are now introduced in said cavities according to FIG. 2G. As an alternative, it would, of course, also be possible however to apply an appropriate adhesive directly onto the components 17. Besides, instead of an adhesive that has to be introduced in liquid form, an adhesive tape may also be used.

Subsequently, the optoelectronic components 17 are inserted into the cavities 14, for example in a form with deflection mirrors 20 put thereon, and they are securely glued with the aid of the adhesive layers 23; cf. FIG. 2H.

It may be mentioned that equipping with the optoelectronic components 17 may, of course, also be effected immediately after the holes 3 have been made in the copper layer 2, as illustrated in FIG. 2B, that is to say also before the application of the pre-assembled layers 11, 12 (with 13) as well as 21 are applied.

Figure 2H:
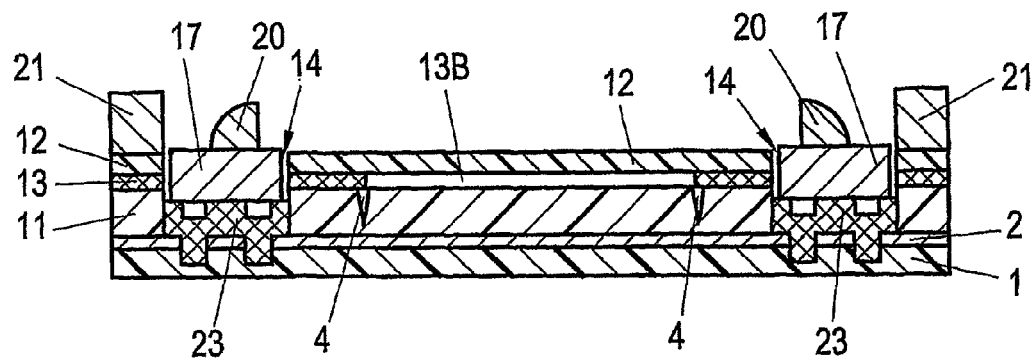
Figure 2I:
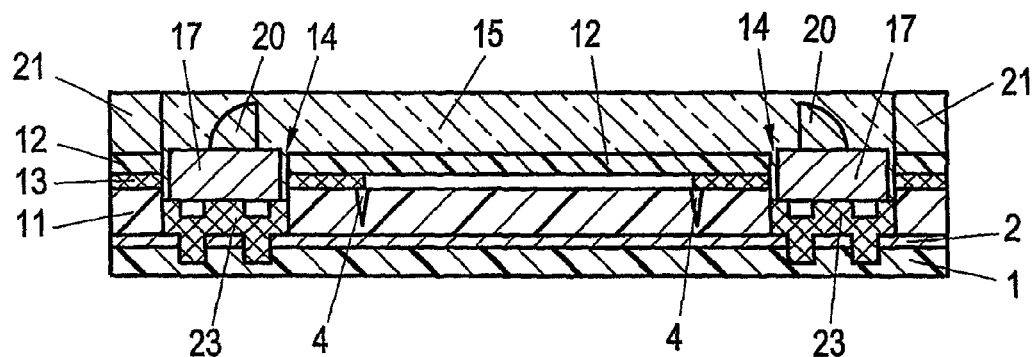

When the structure according to FIG. 2H has been obtained, the optical material 15 can be introduced within the frame 21 and into the cavities 14, the optical material 15 being provided as a resin or as a pouring mass, wherein the components 17 will be completely embedded in the optical material 15, cf. FIG. 2I.

Figure 2J:
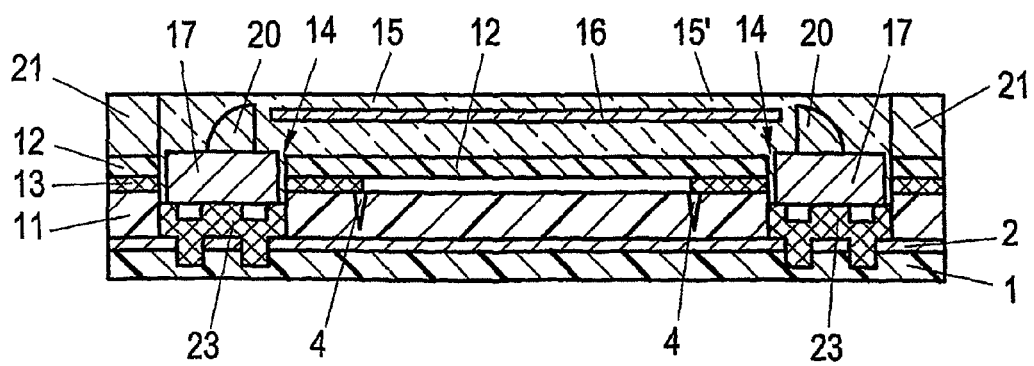

In the optical layer 15' thus obtained, the optical waveguide 16 is then structured according to FIG. 2J in the previously described manner known per se, so as to produce the desired optical communication connection between the components 17. If—depending on the optical material 15—a curing or stabilization of this optical material 15 is required, this step may now likewise be carried out.

According to FIG. 2K, the original carrier material 1, e.g. a carrier film, is then pulled off, and the adhesive 23 is removed in alignment with the component contacts, e.g. 28, for example chemically, or with the aid of laser rays, by plasma ablation etc., so that holes 29 in the copper layer 2 as well as in the adhesive layers 23 in alignment with the contacts 23 form. According to FIG. 2L, the copper layer 2 then is structured, and copper introduction into the holes 29 takes place so that the components 17 are provided with the lower contact faces 24, 25, 26 and 27 already explained above by way of FIG. 2. It will then only be necessary to separate the central part 11B of the substrate 11, or of the pre-preg, respectively, whereupon the rigid-flexible printed circuit board element illustrated in FIG. 2 and having the integrated optical connection to the optical waveguide 16 is obtained.

In FIG. 3, a rigid-flexible printed circuit board element 10 is illustrated in a comparable sectional representation in a manner similar to FIG. 2, wherein, however, in comparison with FIG. 2, a flexible and, for example, also light-impermeable cover layer 22 is additionally provided. This cover layer 22 is applied in the course of the process according to FIGS. 2A-2L, preferably after the step according to FIG. 2L, specifically before the central substrate part 11B is removed. The cover layer 22 protects the optical layer 15' both mechanically and optically with regard to disturbances by external light sources.

In FIG. 4, a modification of the rigid-flexible printed circuit board element 10 according to FIG. 2 is shown insofar as the flexible printed circuit board part 12 is provided with an already structured copper layer 30 with appropriate copper connections which, in the finished structure, thus are inwardly located and protected by being embedded or covered by means of the optical material 15. Moreover, also through-connections can be produced in a conventional manner, for example to the lower side of the printed circuit board element 10, as this is illustrated in FIG. 4 at 31 by way of example. In this embodiment, the optical guide 16 may be utilized as a broadband connection between the components 17, whereby for this a shielding is not required. The electrical connections with the aid of the copper layer 30 can be utilized for a communication with low data rates and/or for a power supply.

By way of comparison, in FIG. 5 a further possibility of electrical connections via conductive tracks for a rigid-flexible printed circuit board element 10 according to FIG. 2 is shown, wherein on the upper side, i.e. on the frame 21 and on the optical layer 15', a further flexible layer 32 with a copper lamination 33 is applied. This may for example be done after the intermediate stage according to FIG. 2K has been achieved, wherein subsequently the copper-plating and structuring as well as, finally, the breaking out of the middle substrate part 11B is carried out so that the assembly according to FIG. 5 will be obtained, in which an integrated optical connection (optical guides 16) as well as an upwardly arranged copper connection—structured copper coating 33—have been realized.

According to FIG. 6, the printed circuit board element 10 may also be structured such that at the beginning, the rigid pre-preg, or substrate 11', respectively, and, thus, the rigid printed circuit board parts 11A, 11B are omitted (in which case also the steps according to FIGS. 2C and 2D are then no longer required). In this case, the printed circuit board element 10 has no decidedly rigid members right from the beginning, but merely comparatively rigid areas 11' in places where the optoelectronic components 17 are provided and cause a "rigidity"; in all other areas it is, however, flexible, cf. the flexible printed circuit board part 12' with the separate bendable printed circuit board part 12 that originally was directly glued to the copper layer 2 via the adhesive layer 13 (FIG. 2A), before the copper layer (cf. step FIG. 2L) had been structured for forming the contact surfaces 24-27, and with the flexible optical layer 15'. Such a printed circuit board element 10 according to FIG. 6 may then be connected in various ways with rigid printed circuit board parts, as is explained hereinafter in more detail.

According to FIG. 7, such a printed circuit board element 10, as illustrated in FIG. 2, 3, 4, 5 or 6 (actually, in FIG. 7 a printed circuit board element 10 according to FIG. 6 is shown), can be put on further printed circuit board parts 34, 35 so as to interconnect them optically. These printed circuit board parts 34, 35 are only quite schematically shown in FIG. 7, and the connection of the printed circuit board element 10 to these printed circuit board parts 34, 35 may, for example be realized by gluing (for example by means of an anisotropic conductive glue), by soldering, by wire bond connections, by micro-via contacting and such technologies. Altogether, the arrangement according to FIG. 7 may then be seen as a rigid-flexible printed circuit board combination 34-10-35. Such printed circuit board modules can also be obtained, or additionally enlarged, respectively, if the arrangement is put on top of another printed circuit board 36, as shown in FIG. 8.

Figure 9:
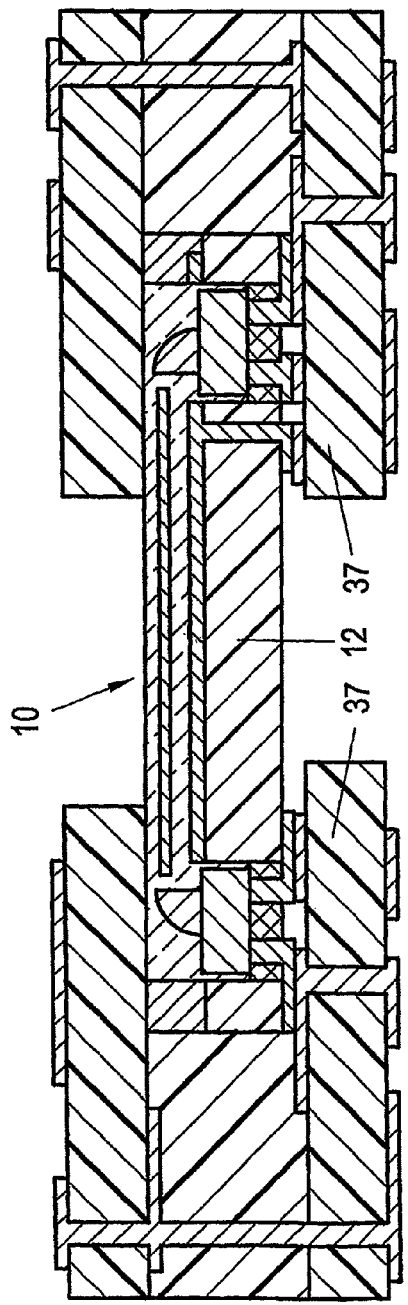

On the other hand, it is, of course, also possible to install a rigid-flexible printed circuit board element 10, as described, in a multilayer arrangement, i.e. to embed it in further printed circuit board layers and compress them therewith. According to FIG. 9, a rigid-flexible printed circuit board element 10 is shown which has been inserted in further printed circuit boards 37 and contacted there, whereupon, finally, pressing into a multilayer printed circuit board has occurred in conventional manner to give the arrangement as schematically shown in FIG. 9. Here, too, it again holds that—similar to arrangements such as according to FIGS. 7 and 8—also rigid-flexible printed circuit board elements 10 according to FIG. 1, 2, 3, 4 or 5—apart from that according to FIG. 6—may be used, as shown in FIGS. 7 to 9.

Figure 10:
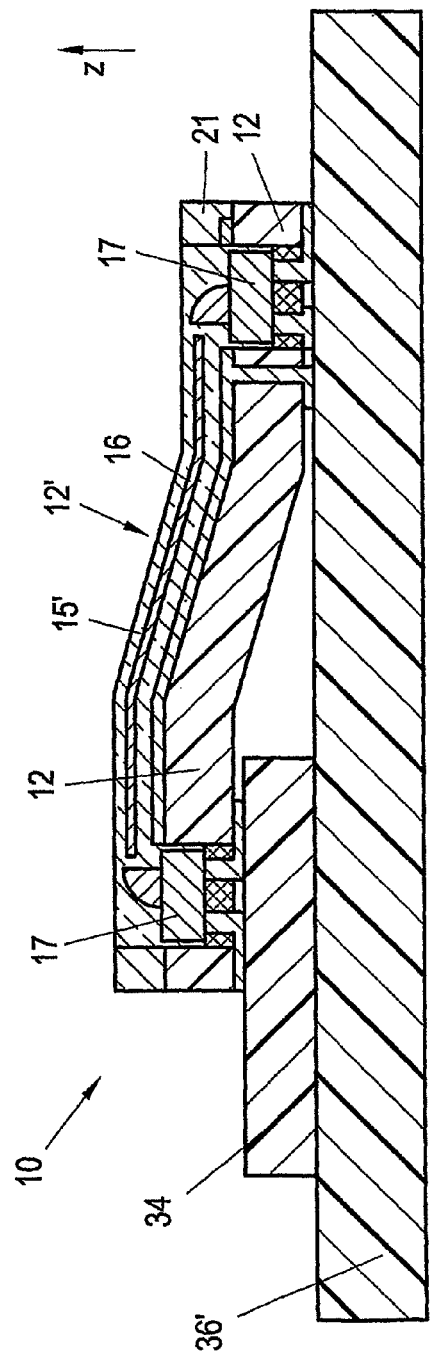

In FIGS. 10 and 11, applications of the present rigid-flexible printed circuit board element 10 using its flexibility are shown. In detail, in FIG. 10 it is shown how a rigid-flexible printed circuit board element 10 as described before for example on the basis of FIG. 6 or else by way of FIG. 1, 2, 3, 4 or 5, can optically connect a printed circuit board module 34 with a motherboard 36', wherein the flexible printed circuit board part 12 with the optical layer 15' and the optical guide 16, i.e. the entire given flexible printed circuit board part 12', provides for an adaptation in z-direction.

In FIGS. 11 and 11A, a comparable arrangement with a motherboard 36' as well as printed circuit board modules 34 and 35' is shown, wherein a branching printed circuit board element 10, by means of optical guide branches 16A, 16B by appropriately outward bending (cf. FIG. 11) leads to the motherboard 36', and to the printed circuit board module 35', respectively, arranged thereabove in a per se conventional manner in the manner of a multilayer arrangement.

Quite generally, the most varying optical guide geometries can be realized with the aid of the present printed circuit board element 10, and the most varying modules can be interconnected by the flexibility of the printed circuit board element 10 at different z-levels so as to be able to convey the communications with high data rates directly to the desired end points without having to take the detour via conventional electric (copper) connections.

Figure 12:
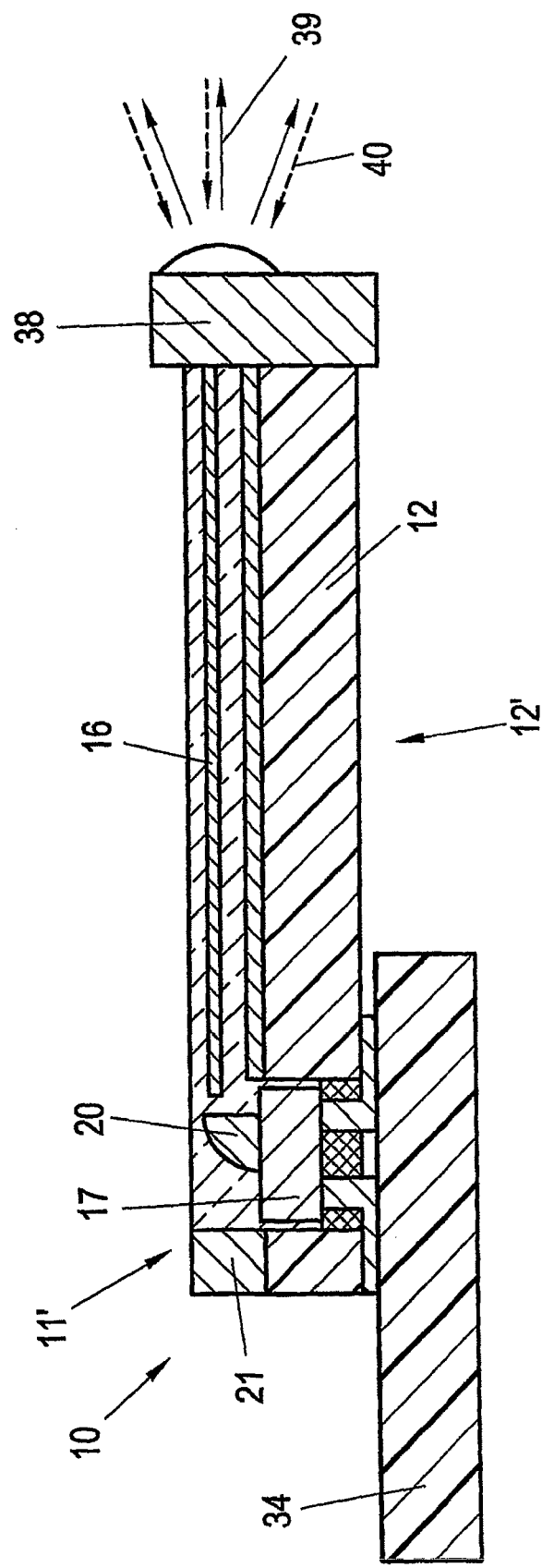
FIG. 12 shows yet another embodiment of a rigid-flexible printed circuit board element according to the invention, wherein here two different functions are illustrated for the sake of simplicity.

Finally, in FIG. 12 an application of the present rigid-flexible printed circuit board element 10 is shown in an embodiment with only one optoelectronic component 17, for example in turn with a deflection mirror 20, this component 17, e.g., being able to function as a light emitter (cf. also the arrows 39 in FIG. 12), yet optionally also as a light detector or light receiver (cf. the arrows 40 entered in broken lines). The optical waveguide 16 is by way of example guided to an external location not illustrated further via a head element 38 (e.g. so as to provide coupling to an optical cable or to an external printed circuit board via an optical connector, or so as to be able to use light, e.g. as a display background illumination, or else for sensory applications, such as when impinging light is detected in the component 17). In the case of a light emitter, the component 17 may, for example be a VCSEL component or a LED, whereas in the case of a light detector, it is formed for example by a photo-diode or another light sensor.

Here, too, it must again be taken into consideration that, even though a printed circuit board element 10 according to FIG. 6 (yet with one component 17 only) is shown in FIG. 12, a configuration approximately according to FIG. 1 or 2 etc. is, of course, also conceivable, i.e. with a rigid printed circuit board part 11 in the region of the optoelectronic component 17 (wherein the printed circuit board part 34 shown in FIG. 12 may also be omitted).

The present printed circuit board element 10 may, of course, also be modified such that in addition to the optoelectronic components 17, also further components are embedded in the optical material 15, in particular in the cavities 14. Thus, in particular, it is conceivable to co-install, together with the optoelectronic components 17, also electronic components, such as a driver chip in the case of a VCSEL component and/or an amplifier chip in the case of a photodiode, as optoelectronic components 17. This is merely quite schematically shown in FIG. 1 at 17'.

The invention claimed is:
1. A rigid-flex printed circuit board element comprising:
(a) at least one rigid printed circuit board portion,
(b) at least one flexible printed circuit board portion connected to the at least one rigid printed circuit board portion; and
(c) at least one cavity, disposed at least in part in the flexible printed circuit board portion, said at least one cavity housing a first optoelectronic component;
wherein the at least one flexible printed circuit board portion comprises a flexible layer of an optical, photo-polymerizable material within which a radiation-structured optical waveguide is present;
wherein the at least one cavity has an edge limiting the cavity;
wherein the first optoelectronic component includes a deflection mirror as light-emitting or light-receiving part:
wherein the first optoelectronic component protects from within the at least one cavity over said edge with its deflection mirror; and
wherein a portion of the deflection mirror of the first optoelectronic component projecting over said edge is in height-wise alignment with the radiation-structured optical waveguide.

2. The printed circuit board element according to claim 1, wherein the cavity is disposed only in the flexible printed circuit board portion.

3. The printed circuit board element according to claim 1, wherein the rigid printed circuit board portion is connected to the flexible printed circuit board portion in a connecting region wherein the flexible printed circuit board portion rests on the rigid printed circuit board portion.

4. The printed circuit board element according to claim 3, wherein the cavity is in the connecting region.

5. The printed circuit board element according to claim 1, wherein a separate flexible printed circuit board portion is affixed on the rigid printed circuit board portion with an adhesive layer.

6. The printed circuit board element according to claim 1, wherein the cavity is disposed in the flexible printed circuit board portion directly adjoining the rigid printed circuit board portion.

7. The printed circuit board element accord to claim 5, wherein the cavity is provided in the adhesive layer.

8. The printed circuit board element according to claim 1, wherein the flexible printed circuit board portion is formed by the flexible layer of the optical material.

9. The printed circuit board element according to claim 1, wherein only the portion of the optoclectronic component consisting of the deflection mirror projects over the edge of the cavity, all other portions of the optoelectronic component being housed within the cavity without projecting over the edge of the cavity.

10. The printed circuit board element according to claim 1, wherein the optoelectronic component is a vertical cavity surface entitling laser (VSEL) component.

11. The printed circuit board element according to claim 1, wherein the optoelectronic component is surrounded by optical, photo-polymerizable material in the cavity.

12. The printed circuit hoard element according to claim 1, wherein the layer of the optical, photo-polymerizable material is surrounded by a flexible frame.

13. The printed circuit board element according to claim 12, wherein the flexible frame is formed by a polyimide film.

14. The printed circuit board element according to claim 1, wherein the layer of the optical, photo-polymerizable material is covered by a flexible cover layer.

15. The printed circuit board element according to claim 3, wherein the printed circuit hoard element comprises a second rigid printed circuit board portion in addition to the at least one rigid printed circuit hoard portion, the second rigid printed circuit board portion being spaced a distance from the at least one rigid printed circuit board portion with the flexible printed circuit board portion bridging the distance between them, and wherein the second rigid printed circuit board portion comprises a cavity with a second optoelectronic component housed therein, and wherein the optical waveguide extends between the respective optoelectronic components of the at least one rigid printed circuit hoard portion and the second rigid printed circuit board portion.

16. A method of producing the printed circuit board element of claim 2, comprising providing a pre-assemble flexible printed circuit board portion with at least one cavity therein and mounting the pro-assembled flexible printed circuit board portion on the at least one rigid printed circuit board portion.

17. The method according to claim 16, comprising applying photo-polymerizable material to the pre-assembled flexible printed circuit board portion only after the pre-assemble flexible printed circuit board portion has been mounted on the rigid printed circuit board portion and then structuring the optical waveguide in the photo-polymerizable material by means of radiation.

* * * * *